United States Patent [19]

Morishita et al.

[11] Patent Number: 4,586,342

[45] Date of Patent: May 6, 1986

[54] DEHUMIDIFYING AND COOLING APPARATUS

[75] Inventors: Masao Morishita, Ibaraki; Toshimi Masuda, Kusatsu, both of Japan

[73] Assignee: Nissin Electric Co., Ltd., Kyoto, Japan

[21] Appl. No.: 703,287

[22] Filed: Feb. 20, 1985

[51] Int. Cl.[4] .............................................. F25B 21/02
[52] U.S. Cl. ................................................................. 62/3
[58] Field of Search ............................................... 62/3

[56] References Cited

U.S. PATENT DOCUMENTS

| | | | |
|---|---|---|---|
| 2,779,172 | 1/1957 | Lindenblad | 62/3 |
| 3,635,037 | 1/1972 | Hubert | 62/3 |
| 3,681,929 | 8/1972 | Schering | 62/3 |
| 4,315,599 | 2/1982 | Biancardi | 62/3 X |
| 4,499,736 | 2/1985 | Lieu et al. | 62/3 |
| 4,506,510 | 3/1985 | Tircot | 62/3 |

Primary Examiner—Lloyd L. King
Attorney, Agent, or Firm—Stiefel, Gross, Kurland & Pavane

[57] ABSTRACT

A dehumidifying and cooling apparatus for keeping the inside of a box containing an electric apparatus at a predetermined temperature and low humidity is provided. The apparatus comprises an electronic cooling element fixed to a heated end of a heat pipe extending through the box, the electronic cooling element and a cooling portion being respectively located inside the box, and a radiating portion being located outside the box, the cooling portion being located inside a vertical vent guide provided within the box, so that the dehumidifying and cooling apparatus can be compact and capable of dehumidifying and cooling the inside of the box efficiently.

16 Claims, 10 Drawing Figures

DEHUMIDIFYING AND COOLING APPARATUS

BACKGROUND OF THE INVENTION

1. Field of the Invention

This invention relates to an apparatus for dehumidifying and cooling the inside of a box such as a breaker, control, or switch box, using an electronic cooling element prepared to utilize the Peltier effect.

2. Disclosure of Prior Art

Conventional dehumidifiers for general use in the condensation of the moisture in the air using electronic cooling elements prepared to utilize the Peltier effect are designed to force moist air within a switch box to be fed into another box having an electronic cooling element, and therefore they must be equipped with pumps, intake and charging pipes. Consequently, such dehumidifiers have recognized disadvantages in that they tend to become over sized and costly.

Japanese Pat. Appln. Laid-Open Gazette 95357/1984 discloses a dehumidifier intended to remedy the above-described shortcomings. Moist air within a switch box is, according to the disclosure, caused to flow into a vent pipe by the convection current generated in between the inside of the switch box and another box having an electronic cooling element. Since neither pump nor fan is required in that case, it is possible to simplify the construction, make the apparatus compact and reduce the cost. However, the disadvantage is that such an apparatus is still too large to be installed within a small capacity control or switch box, because a cooler with cooling fins and a radiator with radiation fins and a transformer are arranged inside the dehumidifier proper. Moreover, the flow of the air caused by dehumidification from and to the box through the external dehumidifier proper will result in a lower air flow rate, thus making the dehumidifying arrangement far from being effective.

In the case of a switch box, for instance, a heating unit such as a transformer may be contained in the box and accordingly cause the temperature therein to exceed what has been predetermined because of the heating unit or solar radiation.

The inside of the switch box must be cooled in such a case but, because the air introduced into the box is warmed while it passes by the radiation fins in the conventional apparatus, there still exists inconvenience arising from the box being not effectively cooled.

SUMMARY OF THE INVENTION

The present invention is to provide a dehumidifying and cooling apparatus with a heat pipe incorporating an electronic cooling element prepared to utilize the Peltier effect, and more specifically the apparatus comprising a box for providing an electric apparatus in which an electric element to be kept at a predetermined temperature and a low humidity is installed; a heat pipe installed through an external wall of the box; an electronic cooling element which is heat-conductively fixed to a heated end of the heat pipe, the heated end being located within the box; cooling fins which are heat-conductively fixed to the cooling face of the electronic cooling element; radiation fins which are heat-conductively fixed to the cooled end of the heat pipe, the cooled end being located outside the box; a drainage mechanism in the box for draining water which is generated by the condensation of a moisture on the cooling fins; and a vent guide in the box forming a vertical ventilation passage provided in the surroundings of the cooling fins.

According to the dehumidifying and cooling apparatus of the present invention, it can achieve a high dehumidifying and cooling effect with a simple structure and compact size, by using the heat pipe installed through the external wall of the box and locating the radiation fins outside the box.

BRIEF DESCRIPTION OF THE DRAWINGS

FIG. 1 is a vertical section view of the apparatus; FIG. 2 is its transverse cross section view; and FIG. 3 is a perspective view of its principal portion.

PREFERRED EMBODIMENTS OF THE INVENTION

Figure 1:
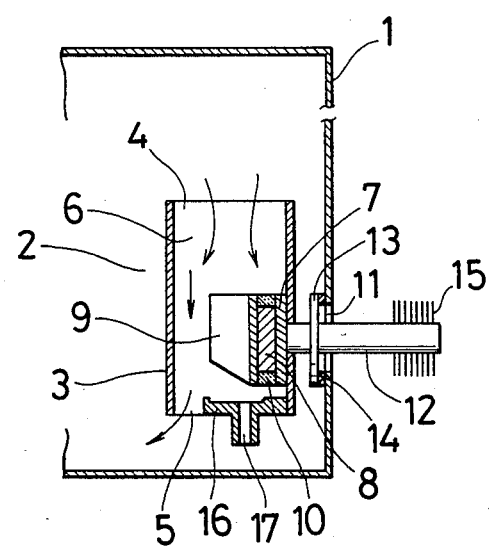
FIGS. 1, 2 and 3 are illustrating a dehumidifying and cooling apparatus embodying the present invention.
Figure 2:
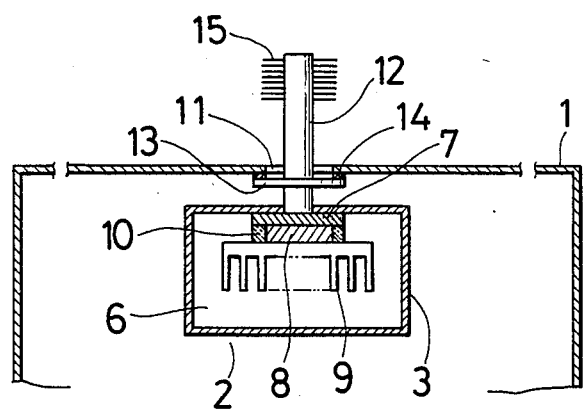
Figure 3:
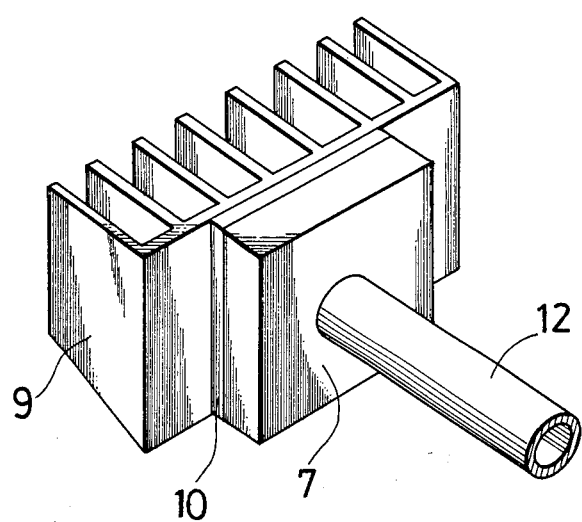

Referring now to FIGS. 1 through 3, an embodiment of the present invention will be described in detail.

In the drawings, there is shown a dehumidifying and cooling apparatus comprising a box 1 such as a switch box; a dehumidifying and cooling apparatus proper 2 (hereinafter called the "apparatus proper") vertically rectangular in cross section in the form of a heat insulating plastic pipe 3, or a vent guide arranged close to the side wall of the box 1; intake and exhaust ports 4, 5 respectively made in the upper and lower faces of the apparatus proper 2; and a vertical ventilation passage 6 communicating with the intake and exhaust ports 4, 5 formed in the apparatus proper 2.

The apparatus also includes a heat-conductive plate 7 made of aluminum or the like and fixed to the inside surface of the rear wall of the plastic pipe 3 of the apparatus proper 2; an electronic cooling element 8 so prepared as to utilize the Peltier effect and fixed to the front surface of the heat-conductive plate 7, the rear heating face of the electronic cooling element 8 being heat-conductively joined to the heat-conductive plate 7; cooling fins 9 heat-conductively fixed to the front cooling face of the electronic cooling element 8 and located in the lower inside portion of the ventilation passage 6, that is, above the exhaust port 5, the electronic cooling element 8 being sandwiched between the heat-conductive plate 7 and the cooling fins 9; a heat insulating material 10 for heat-insulating the cooling portion provided on the pheriphery of the electronic cooling element 8 from the heating portion thereof; a through hole 11 made in the side wall of the box for fitting a heat pipe 12, which is provided through the side wall of the box 1; and a fitting plate 13 fixed close to the front end of the heat pipe 12.

To support the heat pipe 12, it is first inserted into the fitting hole 11 from the inside of the box 1 and the fitting plate 13 is fixed in position with heat insulating packing (14) applied to the circumference of the fitting hole 11. The end of the heat pipe 12 located within the box 1, that is, its heated end is passed through the rear wall of the plastic pipe 13 of the apparatus proper 2 and its end face is heat-conductively joined to the heat-conductive plate 7. Numeral 15 indicates radiation fins provided at the cooled end of the heat pipe 12 located outside the box, that is, on the periphery of the rear end portion thereof.

Figure 8:
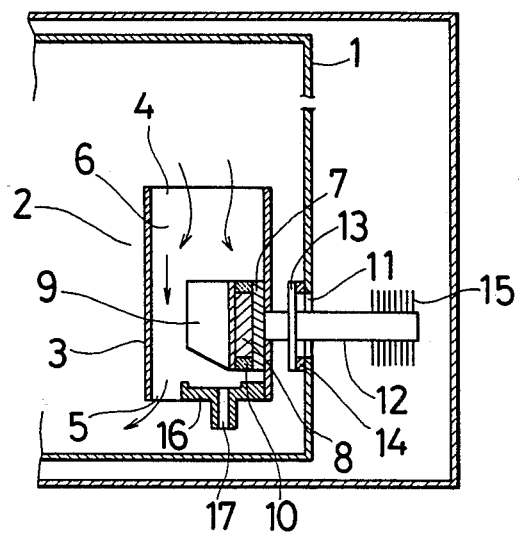
FIG. 8 is a vertical section view illustrating another embodiment of the present invention and corresponding to what is shown in FIG. 1.

As shown in FIG. 8, if it is desirous to employ a double external plate to form the box 1, the air may be distributed to the radiation fins 15 provided in between the inside external plate and the outside one.

In the case of the above-described embodiment shown in FIG. 8, the outside external plate is used as a cover of the radiation fins and, when the apparatus is installed outdoors, the outside external plate intercepts the sunlight, preventing the atmosphere surrounding the radiation fins from being heated by the solar heat and thus the radiating effect of the radiation fins from being damaged.

Numeral 16 shows a drainage mechanism with a drainage port 17 provided below the cooling fins 9 and the drainage port is opened to the outside of the box through, for instance, a drainage pipe.

The operation of the above-described embodiment will subsequently be described.

When the electronic cooling element 8 is driven by a driving power supply (not shown), the temperature of the cooling fins 9 lowers as that of cooling face of the electronic cooling element lowers, whereas the temperature of its heating face rises. The temperature of the heat-conductive plate 7 is simultaneously caused to rise and a working liquid contained in the heat pipe 12 coupled to the heat-conductive plate 7 is allowed to evaporate by the heat of the heat-conductive plate 7. The steam radiates heat at the radiation fins outside the box 1 and is condensed, whereas the heat on the heating face is conducted to the radiation fins 15 through the heat-conductive plate 7 as well as the heat pipe 12 and then radiated therefrom.

The quantity of the heat conveyed by the heat pipe changes with the temperature of the heating face of the electronic element and the quantity of the heat radiated to the outside of the box changes with the quantity of the heat conveyed. This is obvious from the heat conveying characteristics of the heat pipe shown in FIG. 4.

Figure 4:
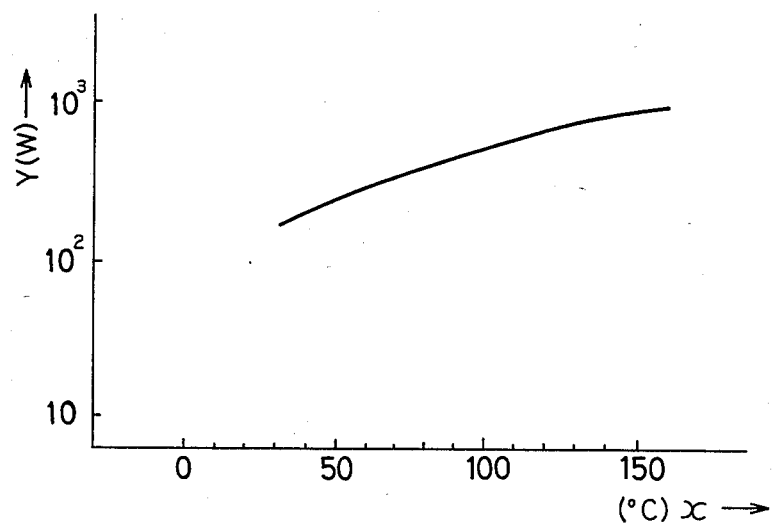
FIG. 4 is a graph illustrating the characteristics of a generally known heat pipe.

In other words, FIG. 4 shows heat conveying characteristics of a heat pipe when water is used as a working liquid, wherein a maximum quantity of heat conveyed (w) and heat pipe heating temperatures (°C.) are shown on the axes of ordinates (Y) and abscissas (X), respectively. As is obvious from the graph, the higher the heating temperature, the greater the quantity of the heat conveyed. The temperature of the heating face is determined by the air temperature and accordingly, if the air temperature in the box lowers, that of the heating face will lower, reducing the quantity of the heat conveyed by the heat pipe 12 and thus what is radiated to the outside of the box 1. On the contrary, if the air temperature in the box is raised, that of the heating face will rise, increasing the quantity of the heat conveyed and thus what is radiated to the outside of the box 1.

In view of the foregoing, it becomes possible to automatically regulate the temperature in the box 1 so as to maintain it within a predetermined range. The temperatures within the above-described range must be present within the predetermined atomspheric temperature range in the box 1 and, although the predetermined temperature range differs according to the electronic element contained therein, it ranges roughly from $-5°$ C. to 55° C.

On the other hand, the temperature of the cooling fins 9 lowers as the electronic cooling element 8 is driven and the moist air existing in the neighborhood of the fins 9 is cooled. If the moist air is cooled, the steam contained in the moist air will be condensed to become water and drained from the drainage port 17 provided in the water bucket 16.

The dehumidified air becomes low temperature dry air and moves to a portion lower than the cooling fins 9, whereas new moist air within the box 1 is caused to flow into the ventilation passage 6 from the intake port 4. Thus the convection current shown by the arrow of FIG. 1 is produced.

The convection current allows the moist air in the box 1 to flow into the ventilation passage and discharge itself therefrom successively, causing the air to dry and cool, that is, air-dehumudifying and -cooling in the box are carried out.

Referring to the drawings again, another embodiment of the invention will be described.

Figure 9:
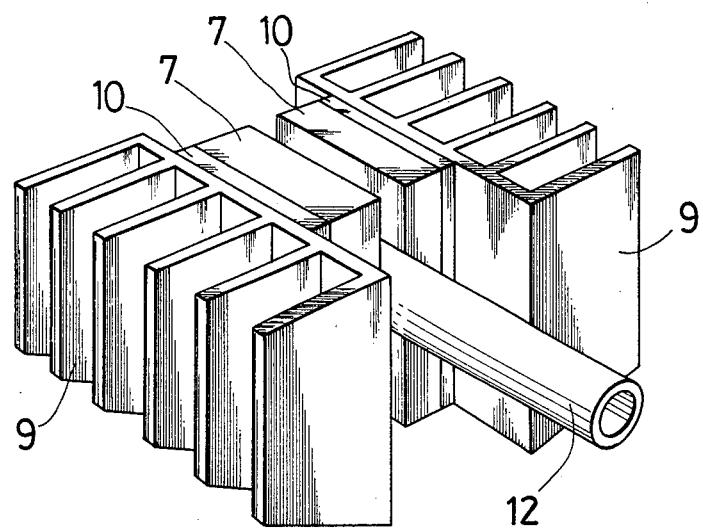
FIG. 9 is a perspective view illustrating still another embodiment of the present invention and corresponding to what is shown in FIG. 3.

As shown in FIG. 9, pairs of heat-conductive plates 7, cooling elements 8 and sets of cooling fins 9 are used, respectively. In other words, the end portion of the heat pipe 12 is sandwiched between the pair of heat-conductive plates 7 facing each other, which are coupled to both sides of the end partions of the heat pipe 12. Since this arrangement makes it possible to provide a larger junction face where the heat-conductive plate 7 and the heat pipe 12 are joined, excellent heat-conductivity is available. Moreover, the dehumidifying and cooling capability is further improved as the pairs of cooling elements 8 as well as sets of cooling fins 9 each are used. In this case, it is preferred to use a heat pipe 12 and radiating fins 15 whose capabilities correspond to those of the cooling elements 8 and the sets of cooling fins 9.

Figure 5:
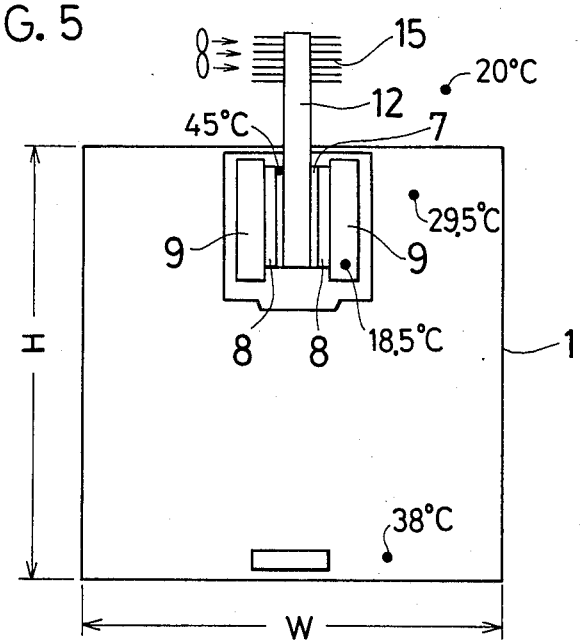
FIGS. 5 and 6 are diagrams illustrating the cooling effect achieved by the dehumidifying and cooling apparatus embodying the present invention.
Figure 10:
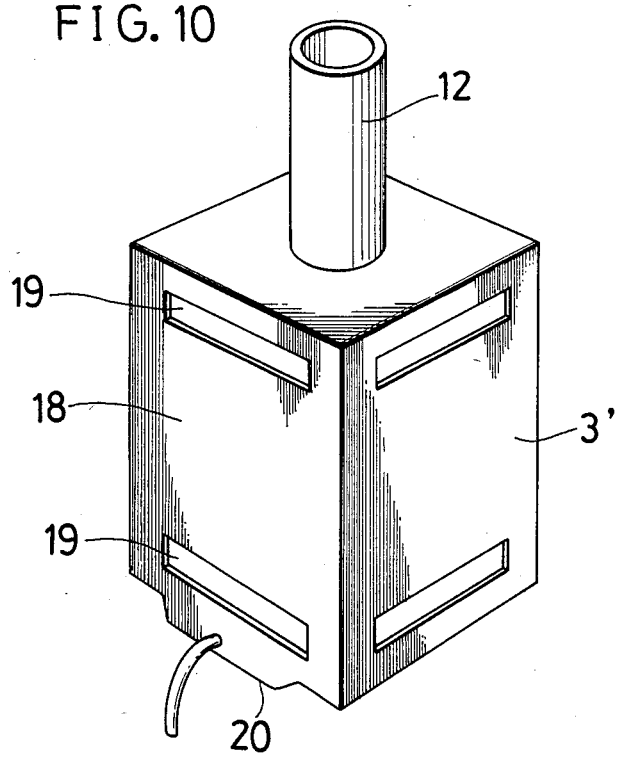
FIG. 10 is a perspective view illustrating another example of the vent guide.

What is shown in FIG. 10 is used for the dehumifying and cooling apparatus of FIG. 5, wherein a box-like vent guide 3' is employed, the vent guide 3' having vents 19 in the upper and lower side walls thereof, and a concave bottom 20 is used as a drainage mechanism. The heat pipe 12 is upwardly projected in this type.

Although reference has been made to the cylindrical bodies as the vent guides 3, 3' made from heat insulating materials in the above descriptions, metal heat-conductors as the vent guides 3, 3' may be used if the electronic cooling elements 8 are attached to the guides 3, 3' in such a manner as to ensure heat insulation, for instance, to prevent the heat generated by the electronic cooling elements 8 from radiating in the box 1 through the guides 3, 3'.

Referring now to test results as an example, the defumidifying and cooling effects achieved by the defumidifying and cooling apparatus according to the present invention will be described in concrete terms.

In this example, the apparatus used was equipped with cooling fins 9 having a surface area of about 600 cm$^2$, radiation fins 15 having a surface area of about 550 cm$^2$, a box 1 70 cm (width)×30 cm (length)×100 cm (height) and two electronic cooling elements 8 whose capacity was 60 W each. When a 175 W heater was operated at the bottom of the box 1, the temperatures in various portions thereof were 38° C. near the heater, 45° C. on the heating face of the heat pipe, 29.5° C. in the air near the cooling fins 9 and 18.5° C. on the surface of the cooling fins 9. This situation is illustrated in FIG. 5.

Like reference numerals in FIG. 5 designates like or corresponding parts in FIGS. 1 and 2.

Figure 6:
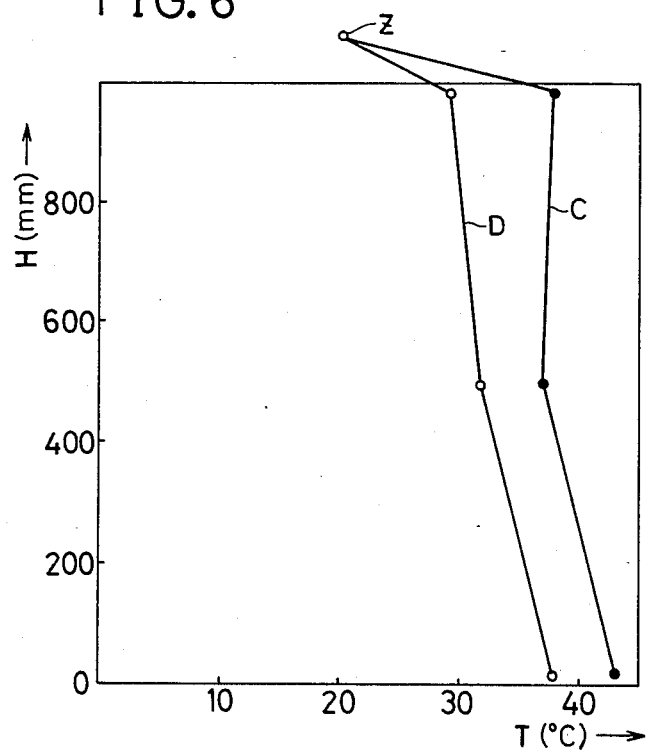

FIG. 6 shows temperature distributions in the vertical direction of the box in both cases where the apparatus according to the present invention was and wasn't installed.

In FIG. 6, the height H above the floor and the temperature T are respectively indicated on the axes of ordinates and abscissas. As is obvious from the graph, the temperature in each portion when the apparatus according to the present invention was installed (actual line D) was lower than that when it was not installed (actual line C), which proved the cooling effect according to the present invention superior. In that case, Z refers to the ambient temperature of the box.

When the ambient temperature of the box was reduced up to about 5° C., that of the heating face of the heat pipe became about 30° C. and heat radiation from the box was prevented, whereas the radiation from the heated portion of the electronic cooling elements 8 was made within the box. Consequently, radiation of the electronic cooling elements 8 and cooling heat were present in directions parallel with each other and only dehumidification was carried out.

Figure 7:
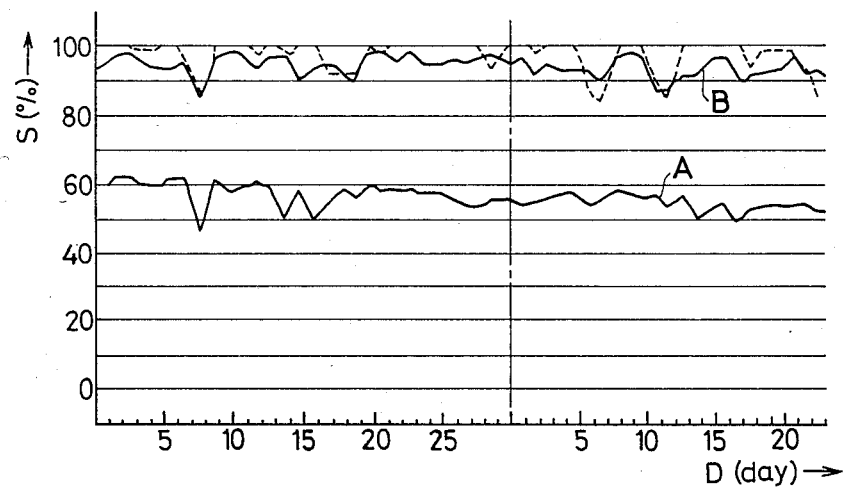
FIG. 7 shows test data illustrating the dehumidifying effect by the dehymidifying and cooling apparatus embodying the present invention.

The test apparatus shown in FIG. 5 was used to test the dehumidifying effect. As shown in FIG. 7, the test results confirmed the intended dehumidifying effect.

In other words, FIG. 7 represents changes in daily maximum humidity for about two months within the boxes 1 when the dehumidifying and cooling apparatus according to the present invention was and wasn't installed, where in the broken line indicates changes in the air humidity and the actual line A shows those in the humidity within the box when the apparatus according to the present invention was installed and the actual line B those in the humidity therein when the apparatus according to the present invention was not installed.

In FIG. 7, the daily maximum humidity (S) and the day (D) involved on the axes of ordinates and abscissas are shown, respectively.

In the dehumidifying and cooling apparatus according to the present invention, the electronic cooling element is driven to lower the temperature of the cooling fins within the box where moist air within the box is dehumidified and the heat produced by the heating face of the electronic cooling element is conducted through the heat pipe and radiated from the radiation fins located at the cooled end of the heat pipe outside the box and, because the cooling and radiating portions of the dehumidifier are respectively located outside and inside the box, the dehumidifying apparatus can be made compact in terms of its volume and readily applicable to any small capacity switch boxes. Moreover, since the convection current of air naturally generated in the box allows moist air within the box to successively flow to the cooling fins, effective dehumidification can be carried out. In case the temperature inside the box should rise, since it will automatically be detected and reduced the temperature within the box can constantly be maintained at within a predetermined range.

What is claimed is:

1. A dehumidifying and cooling apparatus comprising:

a box for housing electric apparatus in which an electric element to be kept at a predetermined temperature and a low humidity may be installed, said box having an external wall;

a heat pie installed through the external wall of the box for containing a heat transferring medium, said heat pipe having a heated end located inside the box and a cooled end located outside the box;

an electronic cooling element, said electronic cooling element having a heating face and a cooling face, the heating face bine heat-conductively fixed to the heated end of the heat pipe;

cooling fins for condensing moisture and cooling the air within the box, said cooling fins being heat-conductively fixed to the cooling face of the electronic cooling element;

radiation fins for radiating heat transferred from within the box to the ambient atmosphere, said radiation fins being heat-conductively fixed to the cooled end of the heat pipe;

drainage means located inside the box beneath the cooling fins for draining water which is generated by the condensation of moisture on the cooling fins; and a vent guide defining a ventilation passage located in the box and surrounding the cooling fins.

2. An apparatus as claimed in claim 1, further comprising a heat conductive plate heat-conductively joined to the heated end of the heat pipe, and wherein said electronic cooling element is sandwiched between the heat conductive plate and the cooling fins, whereby heat generated within the heating face of the electronic cooling element is conducted through the heat conductive plate to the heated end of the heat pipe.

3. An apparatus as claimed in claim 2, wherein the heat pipe has an end face which is heat-conductively joined to the heat conductive plate.

4. An apparatus as claimed in claim 2, further comprising a second heat conductive plate heat-conductively jointed to the heated end of the heat pipe, a second electronic cooling element, and second cooling fins, and wherein said second electronic cooling element is sandwiched between said second heat conductive plate and said second cooling fins.

5. An apparatus as claimed in claim 2, further comprising a heat insulator located between the cooling fins and the heat-conductive plate.

6. An apparatus as claimed in claim 2, wherein the vent guide is fixed to the heat-conductive plate.

7. An apparatus as claimed in claim 1, wherein the drainage mechanism is fixed to the vent guide.

8. An apparatus as claimed in claim 1, wherein the vent guide is cylindrical.

9. An apparatus as claimed in claim 1, wherein the vent guide has a plurality of sidewalls and a bottom defining a box-like shape and wherein one or more of said sidewalls has vents in the upper and lower portions thereof and the drainage mechanism comprises the bottom of the vent guide having an opening therein.

10. An apparatus as claimed in claim 1, wherein the vent guide comprises a heat insulating material.

11. An apparatus as claimed in claim 1, wherein the vent guide comprises a metal.

12. An apparatus as claimed in claim 1, further comprising a heat insulator, and wherein the heat pipe is fixed to the box through the heat insulator.

13. An apparatus as claimed in claim 1, further comprising a cover for covering the radiating fins.

14. An apparatus as claimed in claim 1, wherein the heat pipe has a heat transferring medium therein, said heat transferring medium comprising water at a pressure selected for boiling the water at a set operating temperature of 30° C.

15. An apparatus as claimed in claim 1, wherein the box is a breaker, control, or switch box.

16. The apparatus as claimed in claim 4, wherein said second heat conductive plate, said second electronic cooling element, and said second cooling fins are on one side of said heat pipe in confronting relation with said first-mentioned heat conductive plate, electronic cooling element and cooling fins on the other side of said heat pipe.

* * * * *